(12) United States Patent
Gauthier, Jr. et al.

(10) Patent No.: US 6,187,617 B1
(45) Date of Patent: Feb. 13, 2001

(54) SEMICONDUCTOR STRUCTURE HAVING HETEROGENEOUS SILICIDE REGIONS AND METHOD FOR FORMING SAME

(75) Inventors: Robert J. Gauthier, Jr., Hinesburg; Randy W. Mann, Jericho; Steven H. Voldman, South Burlington, all of VT (US)

(73) Assignee: International Business Machines Corporation, Armonk, NY (US)

(*) Notice: Under 35 U.S.C. 154(b), the term of this patent shall be extended for 0 days.

(21) Appl. No.: 09/363,558

(22) Filed: Jul. 29, 1999

(51) Int. Cl.[7] ............... H01L 21/336; H01L 21/44
(52) U.S. Cl. ............... 438/197; 438/655; 438/664; 438/683
(58) Field of Search .......................... 438/592, 630, 438/649, 651, 655, 664, 682, 683, 197, 199, 275, 279; 257/384, 388, 768, 769, 770

(56) References Cited

U.S. PATENT DOCUMENTS

| | | | |
|---|---|---|---|
| 4,322,453 | 3/1982 | Miller | 438/655 |
| 4,394,673 | 7/1983 | Thompson et al. | 257/478 |
| 4,451,328 | 5/1984 | Dubois | 438/385 |
| 4,643,777 | 2/1987 | Maeda | 438/385 |
| 4,841,347 | 6/1989 | Hsu | 257/413 |
| 4,859,278 | 8/1989 | Choi | 438/238 |
| 5,462,894 | 10/1995 | Spinner et al. | 438/384 |
| 5,510,295 | 4/1996 | Cabral, Jr. et al. | 438/656 |
| 5,545,574 * | 8/1996 | Chen et al. | 438/297 |
| 5,547,881 | 8/1996 | Wang et al. | 438/384 |
| 5,635,746 | 6/1997 | Kimura et al. | 257/382 |
| 5,744,395 | 4/1998 | Shue et al. | 438/305 |
| 5,773,339 | 6/1998 | Okamoto | 438/210 |
| 5,795,808 * | 8/1998 | Park | 438/301 |
| 5,824,600 * | 10/1998 | Byun et al. | 438/682 |
| 5,827,762 | 10/1998 | Bashir et al. | 438/202 |

FOREIGN PATENT DOCUMENTS 62-147757    7/1987    (JP).

OTHER PUBLICATIONS

JPO & Japio Abstract of Japan Document No. 09–283466, Patent Publish Date of Oct. 31, 1997.
JPO & Japio Abstract of Japan Document No. 09–023005, Patent Publish Date of Jan. 21, 1997.
JPO & Japio Abstract of Japan Document No. 08–264482, Patent Publish Date of Oct. 11, 1996.
JPO & Japio Abstract of Japan Document No. 62–147757, Patent Publish Date of Jul. 1, 1987.

* cited by examiner

*Primary Examiner*—T. N. Quach
(74) *Attorney, Agent, or Firm*—Schmeiser, Olsen & Watts; William D. Sabo

(57) ABSTRACT

A process for forming heterogeneous silicide structures on a semiconductor substrate (10) includes implanting molybdenum ions into selective areas of the semiconductor substrate (10) to form molybdenum regions (73, 74, 75, 76). Titanium is then deposited over the semiconductor substrate (10). The semiconductor substrate (10) is annealed at a temperature between approximately 600° C. and approximately 700° C. During the annealing process, the titanium deposited in areas outside the molybdenum regions (73, 74, 75, 76) interacts with silicon on the substrate to form titanium silicide in a high resistivity C49 crystal phase. The titanium deposited in areas within the molybdenum regions (73, 74, 75, 76) interacts with silicon to form titanium silicide in a low resistivity C54 crystal phase because the presence of molybdenum ions in silicon lowers the energy barrier for crystal phase transformation between the C49 phase and the C54 phase.

13 Claims, 4 Drawing Sheets

SEMICONDUCTOR STRUCTURE HAVING HETEROGENEOUS SILICIDE REGIONS AND METHOD FOR FORMING SAME

FIELD OF THE INVENTION

The present invention relates, in general, to semiconductor device fabrication and, more particularly, to forming silicide structures in the fabrication of semiconductor devices.

BACKGROUND OF THE INVENTION

Semiconductor devices and integrated circuits fabricated on semiconductor substrates often include silicide structures serving as conductive electrodes. In some applications such as, for example, electrostatic discharge protection circuits, input/output drivers, etc., high resistance silicide structures are beneficial. In other applications such as, for example, inverters, low noise amplifiers, etc., low resistance silicide structures are beneficial in improving the circuit performance. To form high resistance titanium silicide structures, titanium is disposed on the semiconductor substrate. The substrate then goes through an annealing process at a temperature not exceeding 700 degrees Celsius (° C.), during which titanium interacts with silicon on the substrate to form silicide in an orthorhombic base centered crystal phase referred to as C49. C49 crystal phase silicide has a resistivity between approximately 60 micro-ohm-centimeter ($\mu\Omega$-cm) and approximately 90 $\mu\Omega$-cm. Low resistance silicide structures can be formed in several ways. In one approach, the substrate with high resistivity C49 silicide formed thereon is put through a rapid thermal annealing process at a temperature of between 800° C. and 1000° C. The high temperature annealing transforms the titanium silicide from C49 phase to an orthorhombic face centered crystal phase referred to as C54, which has a resistivity between approximately 12 $\mu\Omega$-cm and approximately 20 $\mu\Omega$-cm. In another approach, the low resistance silicide structures are formed through a refractory metal, e.g., molybdenum, implantation, titanium deposition, and annealing. During the annealing process, the titanium interacts with silicon to form silicide structures in the C54 crystal phase because the molybdenum lowers the barriers for phase transformation from the high resistance C49 crystal phase to the low resistance C54 crystal phase.

In some applications, it is beneficial to have both high and low resistance silicide structures in the same circuit element, or in different circuit elements within the same functional block. It is sometimes also beneficial for process integration to have silicide structures of different characteristics formed on the same semiconductor wafer.

Accordingly, there exists a need for a semiconductor structure that includes heterogeneous silicide structures on a semiconductor substrate and a method or a process for forming such a structure. It is desirable for the process to be simple and efficient. It is also desirable for the process to be compatible with existing semiconductor device fabrication processes.

SUMMARY OF THE INVENTION

A general advantage of the present invention is providing a semiconductor structure that includes heterogeneous silicide structures formed on a semiconductor substrate. Another advantage is providing a simple and efficient process for forming such silicide structures. A particular advantage of the present invention is providing a method for forming silicide structures of different resistivities on a semiconductor substrate. It is a further advantage of the present invention to integrate the heterogeneous silicide formation process into existing device fabrication processes.

These and other advantages of the present invention is achieved through disposing a refractory metal onto selective areas of a semiconductor substrate, depositing a precursory metal over the semiconductor substrate, and annealing the semiconductor substrate at a temperature between approximately 550 degrees Celsius (° C.) and approximately 750° C., preferably between approximately 600° C. and approximately 700° C. During the annealing process, the precursory metal deposited in an area without the refractory metal interacts with silicon on the substrate to form silicide in a high resistivity crystal phase. On the other hand, the precursory metal deposited in an area with the refractory metal interacts with silicon to form silicide in a low resistivity crystal phase because the presence of refractory metal in silicon lowers the barrier of phase transformation from the high resistivity crystal phase to the low resistivity crystal phase. The selective refractory metal disposition can be achieved by covering the areas in which the high resistivity crystal phase silicide is to be formed with photoresist during the refractory metal disposition. The refractory metal disposition can be performed at various stages of semiconductor device fabrication processes, depending on the desired device structures and characteristics.

Figure 1:
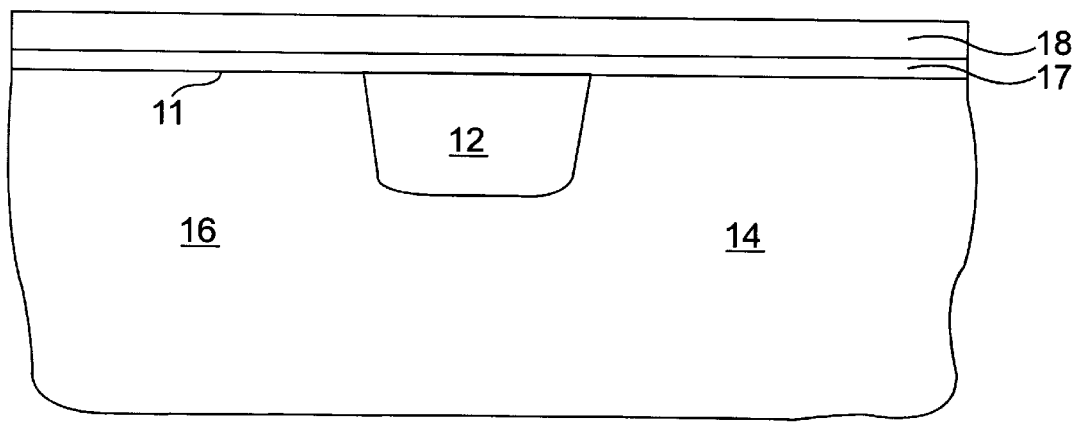
FIG. 1 is a cross sectional view of a semiconductor substrate at an early stage of a semiconductor device fabrication process in accordance with the present invention.

The figures are merely schematic representations, which are not intended to portray specific parameters of the present invention. The figures should not be considered as limiting the scope of the present invention. In addition, the figures are not drawn to scale and elements having similar functions are labeled using the same reference numerals in the figures.

DETAILED DESCRIPTION OF THE PREFERRED EMBODIMENTS

Generally, the present invention provides a method for forming heterogeneous silicide structures on a semiconductor substrate. The method includes selective refractory metal disposition into the semiconductor substrate, precursory metal deposition and annealing. The refractory metal disposed into the semiconductor substrate alters the energy barriers for silicide crystal phase transformation in selected areas. During the annealing process, the precursory metal interacts with silicon to form silicide. The crystal phase of the silicide formed a particular area depends on the silicide crystal phase transformation energy barrier in the area. Therefore, the selective refractory metal disposition results in heterogeneous silicide regions formed on the semiconductor substrate.

FIG. 1 is a cross sectional view of a semiconductor substrate such as, for example, a silicon (Si) substrate 10 at an early stage of a semiconductor device fabrication process in accordance with the present invention. Substrate 10 has a major surface 11, which is also referred to as a front surface of substrate 10. An isolation region 12 is formed in substrate 10 extending from major surface 11 into substrate 10. By way of example, isolation region 12 is a shallow trench isolation region formed by filling a trench in substrate 10 with an insulating material such as, for example, silicon dioxide, silicon nitride, etc. Isolation region 12 separates a portion 14 of substrate 10 from a portion 16 of substrate 10. A dielectric layer 17 is disposed over major surface 11 of substrate 10. Typically, dielectric layer 17 is a layer of silicon dioxide formed using oxide growth, chemical vapor deposition, or other techniques. Dielectric layer 17 is often referred to as a gate oxide layer. A layer 18 of polycrystalline silicon is disposed over dielectric layer 17. Layer 18 is also referred to as a polysilicon layer.

Figure 2:
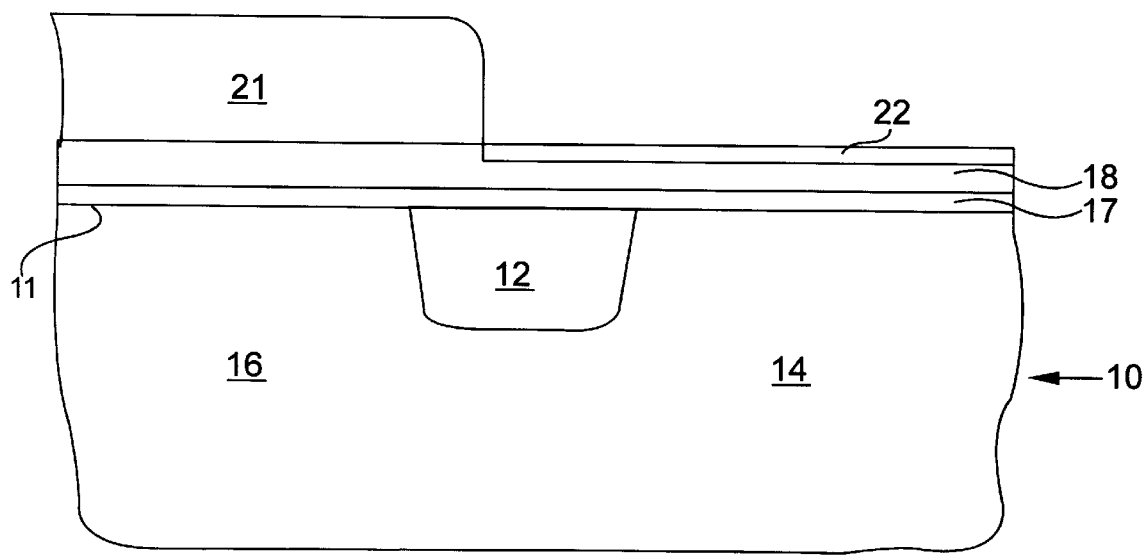
FIGS. 2–4 are cross sectional views of the semiconductor substrate at various stages of a process for forming heterogeneous silicide regions on the semiconductor substrate in accordance with the present invention.
Figure 3:
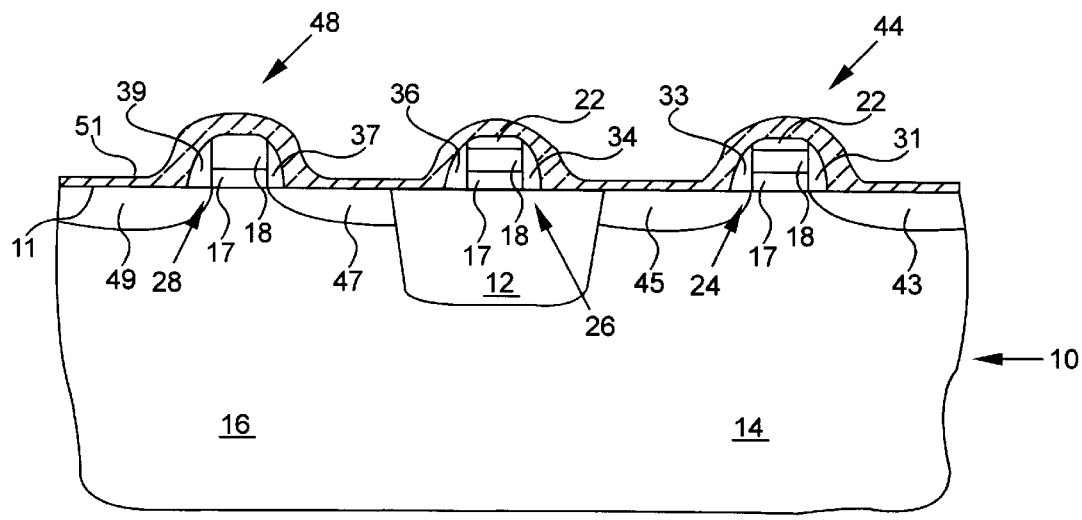
Figure 4:
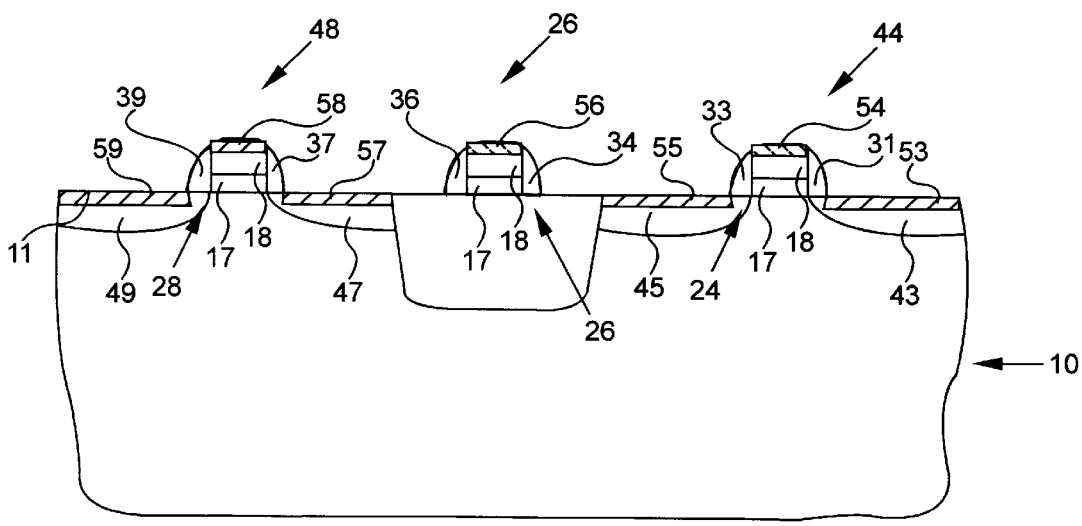

FIGS. 2–4 are cross sectional views of semiconductor substrate 10 at various stages of a process for forming heterogeneous silicide regions on the substrate 10 in accordance with the present invention.

Referring to FIG. 2, a photoresist layer 21 is deposited over substrate 10 and patterned to partially cover polysilicon layer 18. More particularly, after patterning photoresist layer 21, a portion of polysilicon layer 18 that overlies portion 14 of substrate 10 and isolation region 12 is exposed and another portion of polysilicon layer 18 that overlies portion 16 of substrate 10 is covered by photoresist layer 21. In a preferred embodiment, polysilicon layer 18 is doped to increase its conductivity before depositing photoresist layer 21 thereon. A refractory metal such as, for example, molybdenum (Mo) is disposed onto polysilicon layer 18 using patterned photoresist layer 21 as a mask, thereby forming a molybdenum region 22 in polysilicon layer 18 overlying isolation region 12 and portion 14 of substrate 10. Disposing molybdenum onto polysilicon layer 18 is preferably achieved through ion implantation. However, other methods such as, for example, evaporation, sputtering, chemical vapor deposition, etc. can also be used. Preferably, the energy of the ion implantation is adjusted so that molybdenum region 22 is confined to a top portion of polysilicon layer 18. Further, the surface concentration of molybdenum ions in molybdenum region 22 is preferably adjusted for optimizing the fabrication process and device performance. By way of example, the ion implantation energy is between approximately 45 kilo-electron-volts (keV) and approximately 90 keV and the ion implantation dose is between approximately $1 \times 10^{12}$ atoms per square centimeter (atoms/cm$^2$) and approximately $5 \times 10^{14}$ atoms/cm$^2$. If molybdenum is disposed on polysilicon layer 18 through evaporation, sputtering, or chemical vapor deposition, a molybdenum film (not shown) is formed on top of polysilicon layer 18. The thickness of the film preferably does not exceed approximately 2 nanometers (nm). A more preferred range for the film thickness is between approximately 0.5 nm and approximately 1.5 nm.

FIG. 3 shows substrate 10 at a subsequent stage of the fabrication process. Photoresist layer 21 (shown in FIG. 2) is stripped away. Using techniques known in the art, polysilicon layer 18 and dielectric layer 17 are patterned to form a polysilicon gate structure 24 over portion 14 of substrate 10, a polysilicon island 26 over isolation region 12, and a polysilicon gate structure 28 over portion 16 of substrate 10. Through deposition and etching processes known in the art, spacers 31 and 33 are formed around polysilicon gate structure 24. In the same process steps, spacers 34 and 36 are formed around polysilicon island 26, and spacers 37 and 39 are formed around polysilicon gate structure 28. Spacers 31, 33, 34, 36, 37, and 39 are typically formed from an insulating material such as, for example, silicon nitride, silicon dioxide, or the like. A source region 43 and a drain region 45 are formed in portion 14 of substrate 10 adjacent polysilicon gate structure 24. Source region 43 and drain region 45 define a channel region there between under polysilicon gate structure 24. By way of example, source region 43 and drain region 45 are formed by doping portion 14 of substrate 10 with a dopant of N conductivity type. Thus, polysilicon gate structure 24 and portion 14 of substrate 10 form an N channel insulated gate field effect transistor (FET) 44. Likewise, a source region 47 and a drain region 49 are formed in portion 16 of substrate 10 adjacent polysilicon gate structure 28. Source region 47 and drain region 49 define a channel region there between under polysilicon gate structure 28. By way of example, source region 47 and drain region 49 are formed by doping portion 16 of substrate 10 with a dopant of P conductivity type. Thus. polysilicon gate structure 28 and portion 16 of substrate 10 form a P channel insulated gate FET 48. It should be noted that source region 43 and drain region 45 of FET 44 and source region 47 and drain region 49 of FET 48 are not limited to have opposite conductivity types. In other words, FET 44 and FET 48 can be either P channel or N channel field effect transistors. Doping substrate 10 to form source regions 43 and 47 and drain regions 45 and 49 usually includes dopant ion implantation and diffusion. Dopant diffusion is preferably achieved through an annealing process. For example, substrate can be annealed in a furnace for approximately ten minutes at a temperature of approximately 900 degrees Celsius (° C.) in accordance with a preferred embodiment of the present invention. Substrate 10 can also be annealed in a rapid thermal annealing process as desired for device operation. Because the molybdenum ions in polysilicon layer 18 have a low mobility compared with the dopant ions in substrate 10, the dopant diffusion process does not have significant effects on molybdenum region 22. Molybdenum region 22 remains at the top of polysilicon layer 18.

A layer 51 of a precursory metal, e.g., titanium (Ti), is deposited over substrate 10, covering polysilicon layer 18 and major surface 11 of substrate 10. Typically, the titanium is deposited over substrate 10 in a sputtering or chemical vapor deposition process. Next, substrate 10 goes through an anneal process. Preferably, the annealing process is performed in a chamber or compartment filled with nitrogen and at a temperature between approximately 600° C. and approximately 700° C. During the annealing process, the titanium deposited on polysilicon layer 18, source regions 43 and 47, and drain regions 45 and 49 interacts with silicon to form a titanium silicide (TiSi$_2$) layer. More particularly, at the relatively low annealing temperature, not exceeding approximately 750° C., the titanium interacts with silicon, forming titanium silicide having a orthorhombic base centered crystal phase referred to as C49 on polysilicon gate structure 28, source regions 43 and 47, and drain regions 45 and 49. On the other hand, the molybdenum ions in polysilicon gate structure 24 and polysilicon island 26 lowers the phase transformation energy barrier and induces the formation of titanium silicide having a orthorhombic face centered crystal phase referred to as C54. The titanium deposited on isolation region 12 and spacers 31, 33, 34, 36, 37, and 39 stays as metallic titanium. The titanium in contact with the ambient nitrogen in the chamber interacts with the nitrogen and forms titanium nitride. The annealing process is followed by a selective etching process to remove the metallic titanium and titanium nitride from substrate 10.

FIG. 4 shows substrate 10 after the etching process. FET 44 is formed on portion 14 of substrate 10. FET 44 has source region 43, drain region 45, polysilicon gate structure 24, and a channel region between source region 43 and drain region 45 under polysilicon gate structure 24. A silicide source electrode 53 and a silicide drain electrode 55 of C49 crystal phase are formed on major surface 11 of substrate 10, overlying source region 43 and drain region 45, respectively. A silicide gate electrode 54 of C54 crystal phase is formed on polysilicon gate structure 24 and in contact with polysilicon layer 18. FET 48 is formed on portion 16 of substrate 10. FET 48 has source region 47, drain region 49, polysilicon gate structure 28, and a channel region between source region 47 and drain region 49 under polysilicon gate structure 28. A silicide source electrode 57 and a silicide drain electrode 59 of C49 crystal phase are formed on major surface 11 of substrate 10, overlying source region 47 and drain region 49, respectively. A silicide gate electrode 58 of C49 crystal phase is formed on polysilicon gate structure 28 and in contact with polysilicon layer 18. In addition, a silicide pad 56 of C54 crystal phase is formed on polysilicon island 26 and in contact with polysilicon layer 18.

C54 crystal phase silicide and C49 crystal phase silicide have different characteristics. For example, they have different resistivities. Titanium silicide in C54 crystal phase typically has a resistivity between approximately 12 micro-ohm-centimeter ($\mu\Omega$-cm) and approximately 20 $\mu\Omega$-cm. Titanium silicide in C49 crystal phase typically has a resistivity between approximately 60 $\mu\Omega$-cm and approximately 90 $\mu\Omega$-cm. Therefore, C49 crystal phase silicide is often referred to as a high resistance silicide and C54 crystal phase silicide is often referred to as a low resistance silicide. Through selective refractory metal disposition, e.g., selective molybdenum ion implantation, and annealing temperature control described herein above, heterogeneous silicide structures having are formed on semiconductor substrate 10. In other words, a semiconductor structure have heterogeneous silicide regions is formed.

FIGS. 5–8 are cross sectional views of semiconductor substrate 10 at various stages of another fabrication process for forming heterogeneous silicide structures on substrate 10 in accordance with the present invention. As shown in FIG. 1, substrate 10 has an isolation region 12 formed therein. Isolation region 12 separates a portion 14 of substrate 10 from another portion 16 of substrate 10. A dielectric layer 17 is formed over major surface 11 of substrate 10, and a polysilicon layer 18 is disposed over dielectric layer 17.

Figure 5:
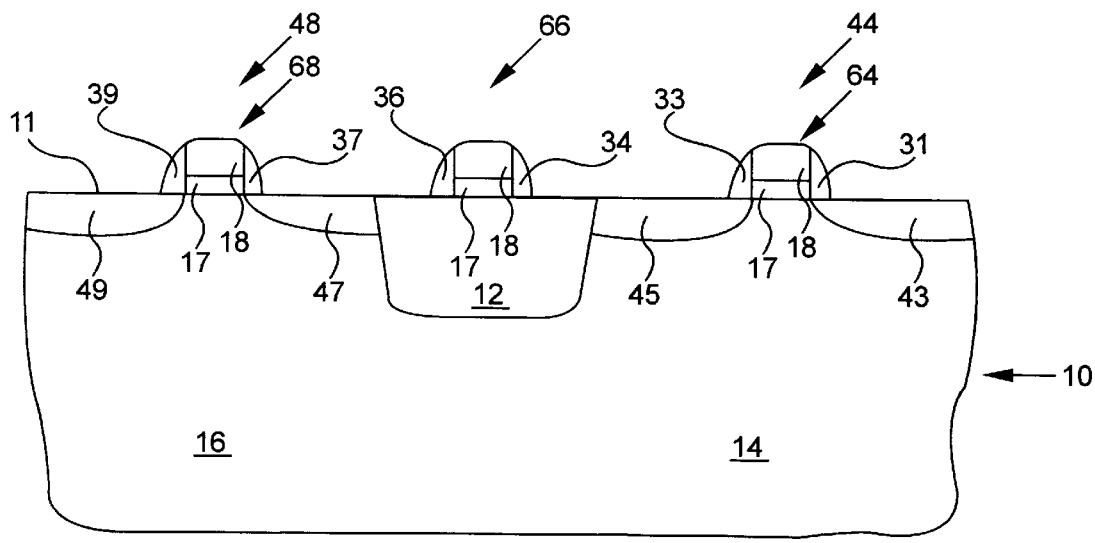
FIGS. 5–8 are cross sectional views of the semiconductor substrate at various stages of another process for forming heterogeneous silicide structures on the semiconductor substrate in accordance with the present invention.

Referring to FIG. 5, FETs 44 and 48 are formed on portion 14 and 16, respectively, of substrate 10 using techniques known in the art. FET 44 includes a polysilicon gate structure 64, a source region 43, and a drain region 45. Source region 43 and drain region 45 define a channel region there between in substrate 10 and under polysilicon gate structure 64. Spacers 31 and 33 are formed around polysilicon gate structure 64. FET 48 includes a polysilicon gate structure 68, a source region 47, and a drain region 49. Source region 47 and drain region 49 define a channel region there between in substrate 10 and under polysilicon gate structure 68. Spacers 37 and 39 are formed around polysilicon gate structure 68. There is also a polysilicon pad or island 66 formed over isolation region 12. Spacers 34 and 36 are formed around polysilicon island 66. Polysilicon gate structures 64 and 68 and island 66 can be formed by patterning polysilicon layer 18 and dielectric layer 17 through etching. Source regions 43 and 47 and drain regions 45 and 49 are formed through doping. Preferably, the process of doping source region 43 and drain region 45 also dopes polysilicon layer 18 in polysilicon gate structure 64. Likewise, the process of doping source region 47 and drain region 49 preferably also dopes polysilicon layer 18 in polysilicon gate structure 68. Polysilicon layer 18 in polysilicon island 66 is preferable also doped, either during the process of doping source region 43 and drain region 45 or during the process of doping source region 47 and drain region 49.

Figure 6:
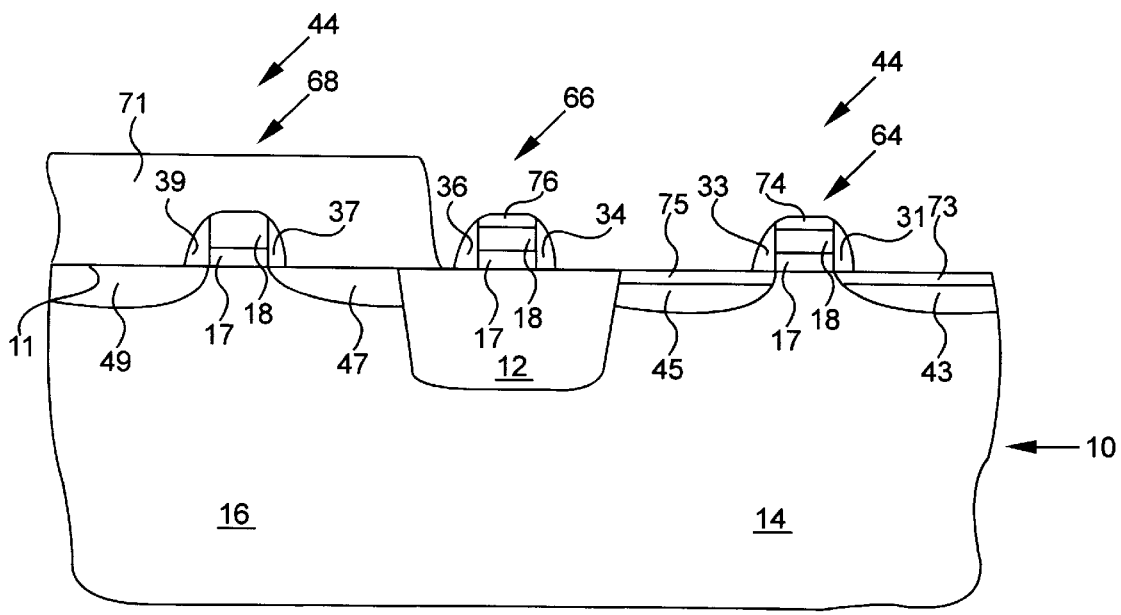

FIG. 6 shows substrate 10 at a subsequent step of the fabrication process. A photoresist layer 71 is deposited over substrate 10 and patterned to partially cover substrate 10. More particularly, after patterning, photoresist layer 71 covers FET 48 on portion 16 of substrate 10. FET 44 on portion 14 of substrate 10 and polysilicon island 66 on isolation region 12 are exposed. A refractory metal such as, for example, molybdenum is disposed onto polysilicon layer 18 and substrate 10 using patterned photoresist layer 71 as a mask. The molybdenum disposition forms a molybdenum region 73 in source region 43, a molybdenum region 75 in drain region 45, a molybdenum region 74 on polysilicon gate structure 64, and a molybdenum region 76 on polysilicon island 66. Disposing molybdenum onto polysilicon layer 18 is preferably achieved through ion implantation. However, other methods such as, for example, evaporation, sputtering, chemical vapor deposition, etc. can also be used. Preferably, the energy of the ion implantation is adjusted so that molybdenum regions 73, 74, 75, and 76 are confined to the top portions of respective source region 43, polysilicon layer 18 in gate structure 64, drain region 45, and polysilicon layer 18 in island 66. Further, the surface concentration of molybdenum ions in molybdenum regions 73, 74, 75, and 76 is preferably adjusted for optimizing the fabrication process and device performance. By way of example, the ion implantation energy is between approximately 45 keV and approximately 90 keV and the ion implantation dose is between approximately $1\times10^{12}$ atoms/cm$^2$ and approximately $5\times10^{14}$ atoms/cm$^2$. Molybdenum can also be deposited on polysilicon layer 18 and major surface 11 of substrate 10 through evaporation, sputtering, or chemical vapor deposition. After deposition, a molybdenum film (not shown) is formed on top of polysilicon layer 18 in polysilicon gate structure 64 and polysilicon island 66 and on top of major surface 11 overlying source region 43 and drain region 45. The thickness of the film preferably does not exceed approximately 2 nm. A more preferred range for the film thickness is between approximately 0.5 nm and approximately 1.5 nm.

Depending on desired device operation, substrate 10 can be annealed after forming molybdenum regions 73, 74, 75 and 76. Because the mobility of molybdenum in silicon is significantly lower than that of the dopants, e.g., N conductivity type dopants phosphorus and arsenic, or P conductivity type dopant boron, the molybdenum ions will usually not diffuse to a depth in substrate 10 comparable the junction depths of source region 43 and drain region 45 in the annealing process. For example, substrate 10 can be annealed in a furnace or in a rapid thermal annealing process.

Figure 7:
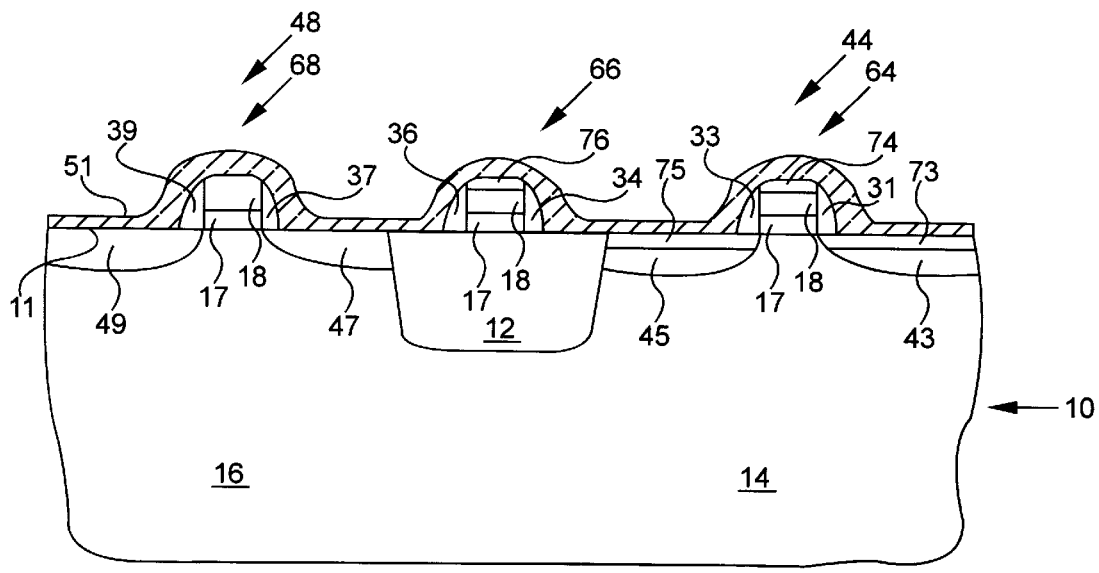

Referring now to FIG. 7, photoresist layer 71 (shown in FIG. 6) is removed. A layer 51 of a precursory metal, e.g., titanium, is deposited over substrate 10, covering polysilicon layer 18 and major surface 11 of substrate 10. Typically, the titanium is deposited over substrate 10 in a sputtering or chemical vapor deposition process. Next, substrate 10 goes through an anneal process. Preferably, the annealing process is performed in a chamber or compartment filled with nitrogen and at a temperature between approximately 600°

C. and approximately 700° C. During the annealing process, the titanium deposited on polysilicon layer 18, source regions 43 and 47, and drain regions 45 and 49 interacts with silicon to form a titanium silicide layer. More particularly, at the relatively low annealing temperature, not exceeding approximately 750° C., the titanium interacts with silicon, forming titanium silicide having a orthorhombic base centered crystal phase referred to as C49 on polysilicon gate structure 68, source region 47, and drain region 49. On the other hand, the molybdenum ions in polysilicon gate structure 64, polysilicon island 66, source region 43, and drain region 45 lowers the phase transformation energy barrier and induces the formation of titanium silicide having a orthorhombic face centered crystal phase referred to as C54. The titanium deposited on isolation region 12 and spacers 31, 33, 34, 36, 37, and 39 stays as metallic titanium. The titanium in contact with the ambient nitrogen in the chamber interacts with the nitrogen and forms titanium nitride. The annealing process is followed by a selective etching process to remove the metallic titanium and titanium nitride from substrate 10.

Figure 8:
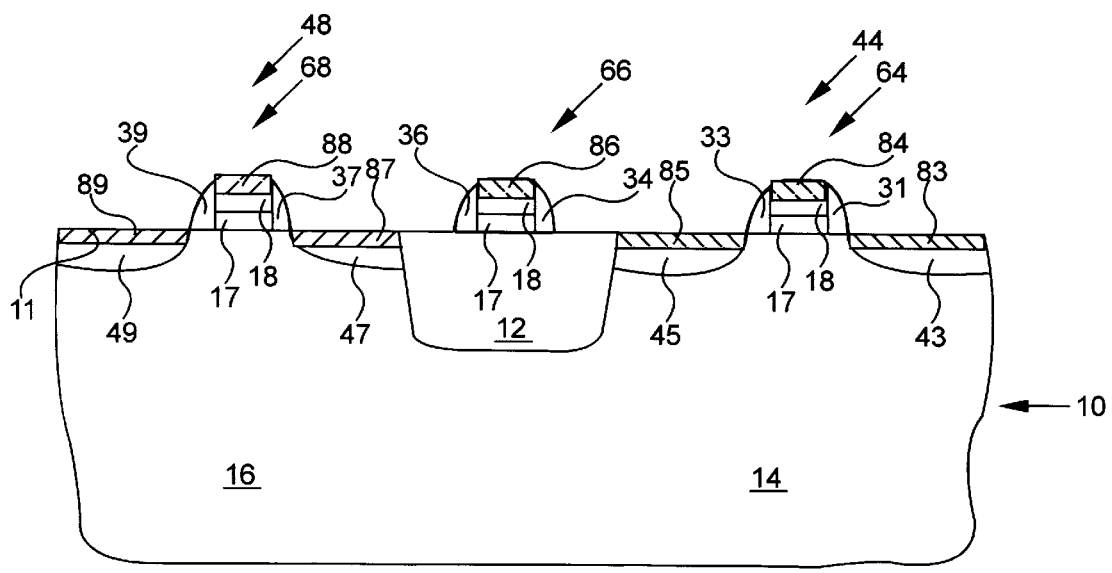

FIG. 8 shows substrate 10 after the etching process. FET 44 is formed on portion 14 of substrate 10. FET 44 has source region 43, drain region 45, polysilicon gate structure 64, and a channel region between source region 43 and drain region 45 under polysilicon gate structure 64. A silicide source electrode 83 and a silicide drain electrode 85 of C54 crystal phase are formed on major surface 11 of substrate 10, overlying source region 43 and drain region 45, respectively. A silicide gate electrode 84 of C54 crystal phase is formed on polysilicon gate structure 64 and in contact with polysilicon layer 18. FET 48 is formed on portion 16 of substrate 10. FET 48 has source region 47, drain region 49, polysilicon gate structure 68, and a channel region between source region 47 and drain region 49 under polysilicon gate structure 68. A silicide source electrode 87 and a silicide drain electrode 89 of C49 crystal phase are formed on major surface 11 of substrate 10, overlying source region 47 and drain region 49, respectively. A silicide gate electrode 88 of C49 crystal phase is formed on polysilicon gate structure 68 and in contact with polysilicon layer 18. In addition, a silicide pad 86 of C54 crystal phase is formed on polysilicon island 66 and in contact with polysilicon layer 18. Therefore, a semiconductor structure have heterogeneous silicide regions thereon is formed through selective molybdenum ion implantation and annealing temperature control.

The process of fabricating semiconductor devices on semiconductor substrate 10 may include additional steps such as, for example, forming interlayer dielectric over FETs 44 and 48, connecting FETs 44 and 48 to other circuit elements (not shown) fabricated on substrate 10. The selective refractory metal disposition and temperature controlled annealing of the present invention are preferably integrated with other steps of semiconductor device fabrication processes known in the art.

It should be understood that, although the process of forming heterogeneous silicide structures on substrate 10 has been described in conjunction with the fabrication of insulated gate field transistors, this is not intended as a limitation of the present invention. The heterogeneous silicide formation process of the present invention can be integrated into the process of fabricating any semiconductor devices, e.g., diodes, bipolar transistors, resistors, capacitors, inductors, etc., on substrate 10. The selective refractory metal disposition can be performed at various stages of a device fabrication process, depending on the process efficiency, desired device characteristics, etc. The refractory metal that can be disposed onto substrate 10 for lowering the energy barrier and inducing silicide crystal phase transformation is not limited to molybdenum. Other refractory metals can also be disposed onto substrate 10 to induce the silicide crystal phase transformation. Refractory metals that can possibly used to induce silicide phase transformation include cobalt (Co), tungsten (W), tantalum (Ta), niobium (Nb), ruthenium (Ru), chromium (Cr), etc. An alloy of several refractory metals may also be disposed onto substrate 10 to induce the desired silicide crystal phase transformation. The precursory metal deposited onto substrate 10 for forming silicide structures is not limited to titanium. In other words, the present invention is not limited to forming heterogeneous titanium silicide structures on substrate 10. Other silicide structures that can be formed on substrate 10 in accordance with the present invention include cobalt silicide, tungsten silicide, etc. The precursory metal layer deposited over substrate 10 can also incorporate other materials such as, for example, silicon (Si), boron (B), carbon (C), nitrogen (N), oxygen (O), aluminum (Al), phosphorus (P), sulfa (S), zinc (Zn), gallium (Ga), germanium (Ge), arsenic (As), selenium (Se), cadmium (Cd), Indium (In), tin (Sn), antimony (Sb), tellurium (Te), magnesium (Mg), thallium (Ti), lead (Pb), Bismuth (Bi), etc.

By now it should be appreciated that a semiconductor structure that includes heterogeneous silicide structures on a semiconductor substrate and a method or a process for forming such a structure have been provided. The heterogeneous silicide structures are formed on the semiconductor substrate through disposing a refractory metal, e.g., molybdenum, into selective areas of the semiconductor substrate, depositing a precursory metal, e.g., titanium, over the semiconductor substrate, and annealing the semiconductor substrate at a temperature not exceeding approximately 750° C. During the annealing process, the titanium deposited in an area without molybdenum interacts with silicon on the substrate to form titanium silicide in a high resistivity C49 crystal phase. The titanium deposited in an area with molybdenum implantation interacts with silicon to form titanium silicide in a low resistivity C54 crystal phase because of the presence of molybdenum ions in silicon. The selective refractory metal disposition can be achieved by covering the areas in which the C49 crystal phase silicide is to be formed with photoresist during the refractory metal disposition process. The heterogeneous silicide formation process of the present invention is simple, efficient, and compatible with existing semiconductor device fabrication processes. The present invention enables semiconductor devices having silicide structures of different characteristics to be fabricated on the same semiconductor substrate. This feature will improve the performance and characteristics of the semiconductor devices and simplify circuit design procedures in some applications.

What is claimed is:

1. A method for forming heterogeneous silicide structures over a semiconductor substrate, comprising the steps of:

disposing a refractory metal onto a first portion of the semiconductor substrate;

depositing a precursory metal over the semiconductor substrate;

annealing the semiconductor substrate at a temperature between approximately 550 degrees Celsius and approximately 750 degrees Celsius to form a first silicide structure on the first portion of the semiconductor substrate and a second suicide structure on a second portion of the semiconductor substrate;

wherein the refractory metal on the first portion of the semiconductor substrate induces a formation of the first silicide structure in a first crystal phase; and wherein the precursory metal on the second portion of the semiconductor substrate interacts with silicon, forming the second silicide structure in a second crystal phase.

2. The method as claimed in claim 1, wherein:

the step of disposing a refractory metal further includes covering the second portion of the semiconductor substrate with a mask; and the step of depositing a precursory metal further includes stripping the mask.

3. The method as claimed in claim 1, wherein the step of disposing a refractory metal includes implanting molybdenum ions onto the first portion of the semiconductor substrate.

4. The method as claimed in claim 1, wherein the step of depositing a precursory metal includes deposing titanium over the semiconductor substrate.

5. The method as claimed in claim 1, wherein the step of annealing the semiconductor substrate further includes the steps of:

placing the semiconductor substrate in a chamber;

filling the chamber with nitrogen; and establishing a temperature between approximately 600 degrees Celsius and approximately 700 degrees Celsius in the chamber.

6. The method as claimed in claim 1, further comprising the steps of:

disposing a dielectric layer on a major surface of the semiconductor substrate;

forming a polycrystalline silicon layer over the dielectric layer;

patterning the polycrystalline silicon layer and the dielectric layer to form a first gate structure and a second gate structure;

wherein the step of disposing a refractory metal further includes disposing the refractory metal into the polycrystalline silicon layer in the first gate structure; and wherein the step of depositing a precursory metal further includes depositing precursory metal on the first gate structure, the second gate structure, and the major surface of the semiconductor substrate.

7. The method as claimed in claim 6, wherein:

the step of patterning the polycrystalline silicon layer and the dielectric layer includes patterning the polycrystalline silicon layer and the dielectric layer before the step of disposing a refractory metal; and the step of disposing a refractory metal further includes disposing the refractory metal into the first portion of the semiconductor substrate.

8. A semiconductor device fabrication process, comprising the steps of:

forming a dielectric layer over a silicon substrate;

forming a polysilicon layer over the dielectric layer;

disposing a refractory metal into a first portion of the polysilicon layer;

patterning the polysilicon layer and the dielectric layer to form a first gate outside the first portion of the polysilicon layer and a second gate within the first portion of the polysilicon layer;

doping the silicon substrate to form a first source region and a first drain region adjacent the first gate, and a second source region and a second drain region adjacent the second gate;

depositing a precursory metal on the polysilicon layer and on the silicon substrate;

annealing the silicon substrate at a temperature between approximately 550 degrees Celsius and approximately 750 degrees Celsius;

wherein the precursory metal on the polysilicon layer in the first gate interacts with silicon, forming a first silicide gate electrode of a first crystal phase;

wherein the precursory metal on the silicon substrate overlying the first source region and the first drain region interacts with silicon, forming a first silicide source electrode and a first silicide drain electrode, respectively, of the first crystal phase over the first source region; and wherein the refractory metal lowers a crystal phase transforming barrier and induces the precursory metal on the polysilicon layer in the second gate to interact with silicon, forming a second silicide gate electrode of a second crystal phase.

9. The semiconductor device fabrication process as claimed in claim 8, wherein the step of annealing the silicon substrate further includes forming a second silicide source electrode of the first crystal phase over the second source region and a second silicide drain electrode of the first crystal phase over the second drain region.

10. The semiconductor device fabrication process as claimed in claim 8, wherein:

the step of patterning the polysilicon layer and the dielectric layer includes patterning the polysilicon layer and the dielectric layer before performing the step of disposing a refractory metal;

the step of disposing a refractory metal further includes disposing the refractory metal into the second source region and the second drain region adjacent the second gate; and the step of annealing the silicon substrate further includes forming a second silicide source electrode of the second crystal phase over the second source region and a second silicide drain electrode of the second crystal phase over the second drain region.

11. The semiconductor device fabrication process as claimed in claim 8, wherein:

the step of disposing a refractory metal includes implanting molybdenum; and the step of depositing a precursory metal includes depositing titanium.

12. The semiconductor device fabrication process as claimed in claim 11, further comprising the step of removing metallic titanium from the silicon substrate in a selective etching process after annealing the silicon substrate.

13. The semiconductor-device fabrication process as claimed in claim 8, further comprising the steps of:

forming an isolation region in the silicon substrate separating the first source region and the first drain region from the second source region and the second drain region;

wherein the step of patterning the polysilicon layer and the dielectric layer further includes forming a polysilicon island over the isolation region;

wherein the step of disposing a refractory metal further includes disposing the refractory metal into the polysilicon layer in the polysilicon island; and wherein the step of annealing the silicon substrate further includes forming a silicide pad of the second crystal phase on the polysilicon island.

* * * * *